United States Patent [19]

Sako et al.

[11] Patent Number: 5,155,485
[45] Date of Patent: Oct. 13, 1992

[54] DIGITAL MODULATING APPARATUS AND DIGITAL DEMODULATING APPARATUS

[75] Inventors: Yoichiro Sako, Chiba; Tamotsu Yamagami, Kanagawa, both of Japan

[73] Assignee: Sony Corporation, Tokyo, Japan

[21] Appl. No.: 603,378

[22] Filed: Oct. 26, 1990

[30] Foreign Application Priority Data

Oct. 31, 1989 [JP] Japan .................................. 1-284403

[51] Int. Cl.⁵ ............................................. H03M 7/00
[52] U.S. Cl. ......................................... 341/95; 341/106
[58] Field of Search ...................... 341/50, 51, 52, 55, 341/95, 106; 364/761, 762, 763, 764

[56] References Cited

FOREIGN PATENT DOCUMENTS 177950 9/1985 European Pat. Off. .
275585 7/1988 European Pat. Off. .
2109200 5/1983 United Kingdom .

Primary Examiner—A. D. Pellinen
Assistant Examiner—B. K. Young
Attorney, Agent, or Firm—Lewis H. Eslinger; Jay H. Maioli

[57] ABSTRACT

This invention relates to a code modulating apparatus and a code demodulating apparatus for digital signals such as PCM audio signal, computer data, and so on. An input signal of M bit words is divided into a plurality of data bits and the code conversion is performed for respective data bits, thereby simplifying the circuit arrangement for data conversion.

9 Claims, 3 Drawing Sheets

Fig. 3

| VALUE | DATA BITS | | | | | CODED BITS | | | | | | |
|---|---|---|---|---|---|---|---|---|---|---|---|---|
| | d5 | d4 | d3 | d2 | d1 | c1 | c2 | c3 | c4 | c5 | c6 | c7 |
| 0  | 0 | 0 | 0 | 0 | 0 | 0 | 0 | 0 | 0 | 0 | 0 | 0 |
| 1  | 0 | 0 | 0 | 0 | 1 | 0 | 0 | 0 | 0 | 0 | 0 | 1 |
| 2  | 0 | 0 | 0 | 1 | 0 | 0 | 0 | 0 | 0 | 0 | 1 | 0 |
| 3  | 0 | 0 | 0 | 1 | 1 | 0 | 0 | 0 | 0 | 1 | 0 | 0 |
| 4  | 0 | 0 | 1 | 0 | 0 | 0 | 0 | 0 | 0 | 1 | 0 | 1 |
| 5  | 0 | 0 | 1 | 0 | 1 | 0 | 0 | 0 | 1 | 0 | 0 | 0 |
| 6  | 0 | 0 | 1 | 1 | 0 | 0 | 0 | 0 | 1 | 0 | 0 | 1 |
| 7  | 0 | 0 | 1 | 1 | 1 | 0 | 0 | 0 | 1 | 0 | 1 | 0 |
| 8  | 0 | 1 | 0 | 0 | 0 | 0 | 0 | 1 | 0 | 0 | 0 | 0 |
| 9  | 0 | 1 | 0 | 0 | 1 | 0 | 0 | 1 | 0 | 0 | 0 | 1 |
| 10 | 0 | 1 | 0 | 1 | 0 | 0 | 0 | 1 | 0 | 0 | 1 | 0 |
| 11 | 0 | 1 | 0 | 1 | 1 | 0 | 0 | 1 | 0 | 1 | 0 | 0 |
| 12 | 0 | 1 | 1 | 0 | 0 | 0 | 0 | 1 | 0 | 1 | 0 | 1 |
| 13 | 0 | 1 | 1 | 0 | 1 | 0 | 1 | 0 | 0 | 0 | 0 | 0 |
| 14 | 0 | 1 | 1 | 1 | 0 | 0 | 1 | 0 | 0 | 0 | 0 | 1 |
| 15 | 0 | 1 | 1 | 1 | 1 | 0 | 1 | 0 | 0 | 0 | 1 | 0 |
| 16 | 1 | 0 | 0 | 0 | 0 | 0 | 1 | 0 | 0 | 1 | 0 | 0 |
| 17 | 1 | 0 | 0 | 0 | 1 | 0 | 1 | 0 | 0 | 1 | 0 | 1 |
| 18 | 1 | 0 | 0 | 1 | 0 | 0 | 1 | 0 | 1 | 0 | 0 | 0 |
| 19 | 1 | 0 | 0 | 1 | 1 | 0 | 1 | 0 | 1 | 0 | 0 | 1 |
| 20 | 1 | 0 | 1 | 0 | 0 | 0 | 1 | 0 | 1 | 0 | 1 | 0 |

DIGITAL MODULATING APPARATUS AND DIGITAL DEMODULATING APPARATUS

BACKGROUND OF THE INVENTION

1. Field of the Invention

This invention relates to a digital modulating apparatus and a digital demodulating apparatus used for recording a PCM audio signal, digital data used in a computer, etc., on an optical disc or other recording medium.

2. Description of the Prior Art

In order to record digital data on a magnetic tape, optical disc or other recording medium, the digital data to be recorded is modulated. This modulation is called digital modulation or channel coding. There has been proposed various methods of digital modulation. Parameters of evaluation of digital modulating methods involved window margins Tw, minimum length between transition Tmin, maximum length between transition Tmax, recording density DR (density ratio), and so on. Digital modulating methods that have been proposed heretofore are directed to removal of a DC component in a frequency spectrum of a modulated signal (so-called DC free) and an increase of the minimum length between transition Tmin or an increase of the window margin Tw.

For example, EFM (eight to fourteen modulation) employed in a CD (compact disc) converts 8 data bits into 14 bits as channel described in Japanese Patent Laid Open Publication No. Sho 57-48848. Selected are bit patterns of 14 bits which include two or more "0"s (logic 0) sandwiched between "1" (logic 1) and "1". Bit patterns which satisfy this condition include 277 patterns from among ($2^{14}$=16,384) patterns, and these 277 include 267 patterns whose Tmax's do not exceed a predetermined value. 256 patterns among these 267 patterns are associated with 256 8-bit data bits by one to one.

When indicating the data bit interval by Tb, the above-mentioned EFM has the parameters indicated below:

$Tw = (8/17) \, Tb$ $Tmin = 3Tw = (24/17) \, Tb$ $Tmax = 11Tw = (88/17) \, Tb$ $DR = (24/17)$ Respective symbols of 14 bits satisfy the condition that two or more "0"s are placed between "1" and "1". In order to satisfy this condition also between symbols, 3-bit coupling bits are used. Four such coupling bits are (000), (100), (010) and (001). One of four coupling bits is determined so as to satisfy the parameters Tmin, Tmax, etc., and to minimize DSV (digital sum value: where the summation is done regarding high levels as 1 and low levels as 1) of data after modulation. By deciding the coupling bit according to this rule, low frequency components of the modulated data can be reduced. Therefore, data bits in the form of 8 bits are finally converted into channel bits in the form of 17 bits.

The prior art digital modulating method for converting M bits into N bits has been performed by an arrangement which preliminarily obtains conversion tables using a computer, etc., then enters data of M bits in ROM or PLA storing the tables, and then obtain a coded output of N bits or (N−p) bits (where p is the bit number of coupling bits). Therefore, the data converting portion occupies a large part of the circuit arrangement and prevents scale reduction of the circuit.

OBJECTS AND SUMMARY OF THE INVENTION

It is, therefore, an object of the invention to provide a digital modulating apparatus which performs the conversion from M bits into N bits for every given part thereof, thereby to contribute to simplification of a data converting arrangement.

It is another object of the invention to provide a digital demodulating apparatus which can be used with the digital modulating apparatus.

It is still another object of the invention to provide a digital modulating method which performs the conversion from M bits into N bits for every given part thereof, thereby to contribute to simplification of a data converting arrangement.

According to an aspect of the invention, there is provided a digital modulating apparatus for coding a digital signal of M bits into a digital signal of N (M<N) bits, comprising:

dividing means for dividing an input signal of M bits by a predetermined number and outputting a signal indicative of a quotient and a signal indicative of a residue, respectively;

code converting means for converting output signals of said dividing means into $n_i$ bits $$\left( \sum_{i=1}^{k} n_i = N \right),$$

respectively; and composing means for composing said $n_i$ bits and outputting the composition result.

According to another aspect of the invention, there is provided a digital demodulating apparatus for demodulating a signal which is obtained by coding a digital signal of M bits into a digital signal of N (M <N) bits, comprising:

distributing means for dividing an input signal of N bits into signals of $n_i$ bits $$\left( \sum_{i=1}^{k} n_i = N \right)$$

and outputting the signals of $n_i$ bits;

code converting means for converting said signals of $n_i$ bits into signals indicative of a quotient and a residue, respectively which are obtained by dividing the signal of M bits by a predetermined number;

multiplying means for multiplying the signal indicative of the quotient of the outputs of said code converting means by the predetermined number; and adding means for adding the signal indicative of the residue of the outputs of said code converting means and an output signal of said multiplying means.

According to still another aspect of the invention, there is provided a digital modulating method for coding a digital signal of M bits into a digital signal of N (M<N) bits being configured to select a group of integers equal to or larger than 2 ($l_1, l_2, \ldots, l_k$) which satisfy $$\left(2^M \leq \prod_{i=1}^{k} l_i\right)$$

and to perform the coding of M bits into N bits by converting $l_i$ into $n_i$ bits $$\left(\sum_{i=1}^{k} n_i = N\right).$$

In order to perform modulation satisfying the condition that the number of successive "0"s interposed between "1" and "1", including a coupling portion, (N=13) is required for (M=8). 8-bit data is divided by a predetermined number, 20, for example, into a quotient from 0 to 12 and a residue from 0 to 19. 6 bits are necessary for modulating the thirteen possible values of quotients according to the foregoing rule, and 7 bits are necessary for modulating the twenty possible values of residues. Therefore, a coded-bit word of 13 bits is obtained. In this example, (k=2, $l_1$=13, $l_2$=20, $l_1 \times l_2$=260, $n_1$=6 and $n_2$=7).

Such partial conversion enables scale reduction of the converter circuit as compared to a conversion process from 8 bits into 12 bits, excluding coupling bits.

The above, and other, objects, features and advantages of the present invention will become readily apparent from the following detailed description thereof which is to be read in connection with the accompanying drawings.

BRIEF DESCRIPTION OF THE DRAWINGS

FIG. 3 is a schematic view showing a conversion table;

DETAILED DESCRIPTION OF THE PREFERRED EMBODIMENTS

Figure 1:
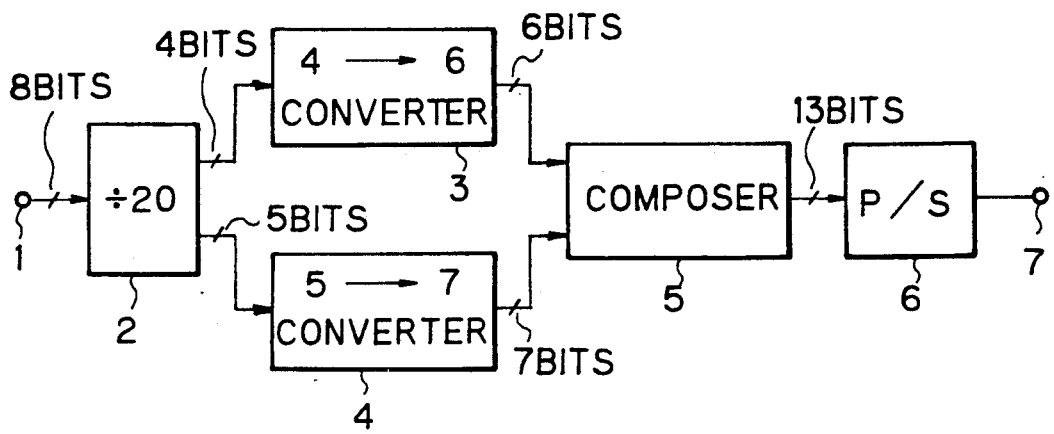
FIG. 1 is a block diagram of a modulating circuit used in an embodiment of the invention.

This embodiment is an example of (M=8 and N=13). Data is composed in byte units in 8-bit most cases, and (M=8) envisages a wide use. In order to ensure that coded bits obtained by modulation, including its coupling portions, have one or more "0"s (logic 0) between "1" (logic 1) and "1", (N=13) is required. The case where the number of successive "0"s sandwiched by "1" is one is expressed as (d=1). In realizing the above matter with a conventional process, data bits (8 bits) are converted into coded bits (12 bits), and a coupling bit "0" is added to a coupling portion between adjacent sets of coded bits. Therefore, an (8 to 12) converter circuit for 256 kinds of conversion is required.

In this embodiment, 8-bit data is divided by 20 into a quotient and a residue. In this case, the quotient is (0, 1, ..., or 12), and the residue is (0, 1, ..., or 19). More specifically, division provides a quotient of 4 bits and a residue of 5 bits. This embodiment is an example of ($l_1$=13 and $l_2$=20), and the following expression is established:

$$2^8 \leq \prod_{i=1}^{2} l_i = l_1 \times l_2 = 260$$

Thus, 256 kinds of 8-bit data can be expressed by their quotients and residues. These quotients and residues are converted into coded bits, respectively.

In order to convert a quotient of 4 bits, including the coupling portions, so as to satisfy the condition of (d=1), 6 bits including the coupling bits "0" are required. In order to convert a quotient of 5 bits, including the coupling portions, so as to satisfy the condition of (d=1), 7 bits including the coupling bits "0" are required. Therefore, (4 to 6) conversion and (5 to 7) conversion are performed, respectively, to obtain coded bits of 13 bits.

Such partial conversion may take another form which performs 13 kinds of conversion and 20 kinds of conversion, respectively. Therefore, it permits a further scale reduction of the converter circuit as compared with a process for effecting 256 kinds of conversion, simplifies the converter circuit by common use of conversion tables, and increases the processing speed by parallel processings.

Parameters of the embodiment, shown below, are identical to those of the process which performs (8–12) conversion and adds the coupling bit "0".

Figure 2:
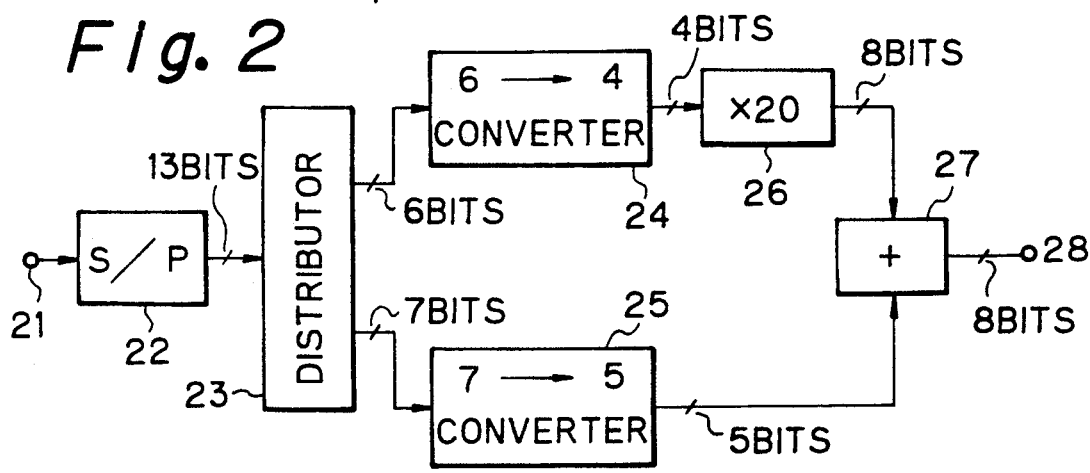
FIG. 2 is a block diagram of a demodulator circuit used in the embodiment of the invention.

$Tw=(8/13)\ Tb=0.615\ Tb$ $Tmin=2Tw=(16/13)\ Tb=1.23\ Tb$ $Tmax=13Tw=8\ Tb$ $DR=1.23$ FIG. 1 shows a modulator circuit using the embodiment, and FIG. 2 shows an associated demodulator circuit. In FIG. 1, reference numeral 1 denotes an input terminal supplied with digital data to be recorded on a recording medium such as magneto-optical disc. The input data is in the form of 8-bit parallel data. A divider circuit shown at 2 divides the input data by 20.

A quotient (4 bits) obtained by the divider circuit 2 is fed to a data converter circuit 3, and a residue (5 bits) is fed to a data converter circuit 4. The data converter circuit 3 converts the data bits of 4 bits into coded bits of 6 bits, and the data converter circuit 4 converts the data bits of 5 bits into coded bits of 7 bits. These data converter circuits 3 and 4 produce coded bits which satisfy the condition (d=1), including the coupling portions. The data converter circuits 3 and 4 are made of ROM, PLA and so on.

Output data of the data converter circuits 3 and 4 are fed to a composer circuit 5 and converted into data of 13 parallel bits. An output of the composer circuit 5 is fed to a parallel-serial converter circuit 6, and it is taken out as serial data at an output terminal 7. The serial data is supplied to a recording circuit not shown, and recording data formed in the recording circuit is fed to an optical pickup and recorded on an optical magnetic disc.

The data reproduced from the magneto-optical disc is fed to an input terminal 21 of the demodulator circuit shown in FIG. 2. Data of 13 parallel bits from a serial-parallel converter circuit 22 is fed to a distributor circuit 23, and it is divided into coded bits of 6 bits and coded bits of 7 bits, respectively. The coded bits of 6 bits are supplied to a data converter circuit 24 which then outputs data bits of 4 bits, in contrast to the data converter circuit 3 of the modulator circuit. The coded bits of 7 bits are fed to a data converter circuit 25 which then outputs data bits of 5 bits, in contrast to the data converter circuit 4 of the modulator circuit.

Since the output of the data converter circuit 24 is a quotient, it undergoes processing of ($\times 20$) by a multiplier circuit 26. An adder circuit 27 adds the output of the data converter circuit 25 indicative of a residue to an output of 8 bits from the multiplier circuit 26. Therefore, original data of 8 bits is obtained at an output terminal 28 of the adder circuit 27.

In the foregoing modulator circuit and demodulator circuit, data conversion of (4 to 6) and data conversion of (5 to 7) may be performed referring to different tables. This embodiment uses a conversion table shown in FIG. 3 in which both are partly common. A quotient obtained by the dividing processing is in the form of 4 bits from $d_1$ to $d_4$. Corresponding to the quotient, values 0 to 12 of data bits are converted into coded bits of 6 bits. The coded bits consist of 6 bits from $c_2$ to $c_7$, excluding $c_1$. The leading bit $c_2$ ("0") of the 6 bits is a coupling bit. In order to convert 13 forms of data so as to satisfy ($d=1$), 6 bits are required.

Corresponding to the residue ($d_1$ to $d_5$) obtained by the dividing processing, values 0 to 19 of the data bits are converted into coded bits of 7 bits. The coded bits consist of 7 bits from $c_1$ to $c_7$. The leading bit $c_1$ ("0") of the 7 bits is a coupling bit. In order to convert 20 forms of data so as to satisfy ($d=1$), 7 bits are required.

Using the conversion table shown in FIG. 3 as described above, two data conversions can be done. Explained below is a further embodiment which, taking note of this point, commonly uses a data converter circuit for two data conversions to perform digital modulation in a time-divisional processing.

Figure 4:
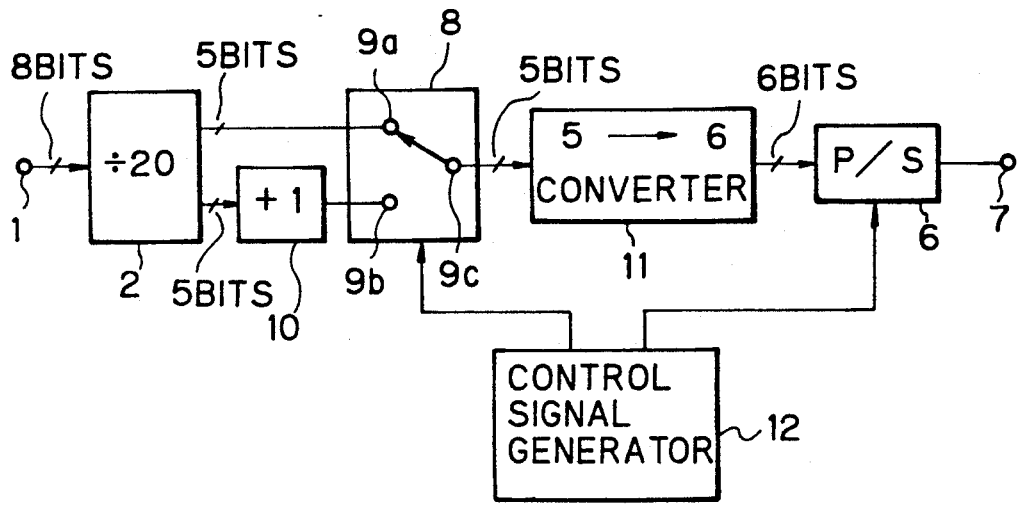
FIG. 4 is a block diagram of a modulator circuit used in a further embodiment of the invention.

FIG. 4 shows a modulator circuit used in the further embodiment. A divider circuit 2 supplies outputs of 5 bits as a quotient and a residue. The quotient may be in the form of 4 bits. However, "0" as an MSB is added thereto to form data of 5 bits. 5 bits as the residue are fed to one input terminal 9a of a switching circuit 8. The residue of 5 bits is fed to a (+1) circuit 10. The ($\rightleftharpoons 1$) circuit 10 is provided to prevent that coded bits consisting of "0"s alone are generated as coded bits corresponding to the residue. An output of values (1 to 20) of the (+1) circuit 10 is fed to the other input terminal 9b of the switching circuit 8. Data of 5 bits is input to a data converter circuit 11 from an output terminal 9c of the switching circuit 8.

The data converter circuit 11 is configured to convert the entered data into 6 bits from $c_2$ to $c_7$, excluding $c_1$, among 7-bit coded bits shown in FIG. 3. Coded bits of 6 bits from the data converter circuit 11 are fed to a parallel-serial converter circuit 6, and an serial output data is obtained at an output terminal 7.

A control signal for controlling the switching circuit 8 and the parallel-serial converter circuit 6 is generated by a control signal generator circuit 12. Quotients and residues coming from the divider circuit 2 are sequentially converted into respective coded bits. The input terminal 9a and the output terminal 9c are first connected and, when conversion of the quotient is finished, the input terminal 9b and the output terminal 9c are connected. In order to add "0" as a coupling bit at the head of 6-bit bit coded bits corresponding to the residue in the parallel-serial converter circuit 6, a control signal is preliminarily fed to the parallel-serial converter circuit 6. Output data from the parallel-serial converter circuit 6 consists of coded bits in which leading 6 bits indicate the quotient, subsequent 1 bit is a coupling bit, and subsequent 6 bits are a converted form of the residue.

Therefore, in the same manner as the former embodiment, 8-bit data is converted into coded bits in the form of 13 bits. Since the instant embodiment uses a common conversion table and employs a time-divisional processing, the data converter circuit may be only one.

Figure 5:
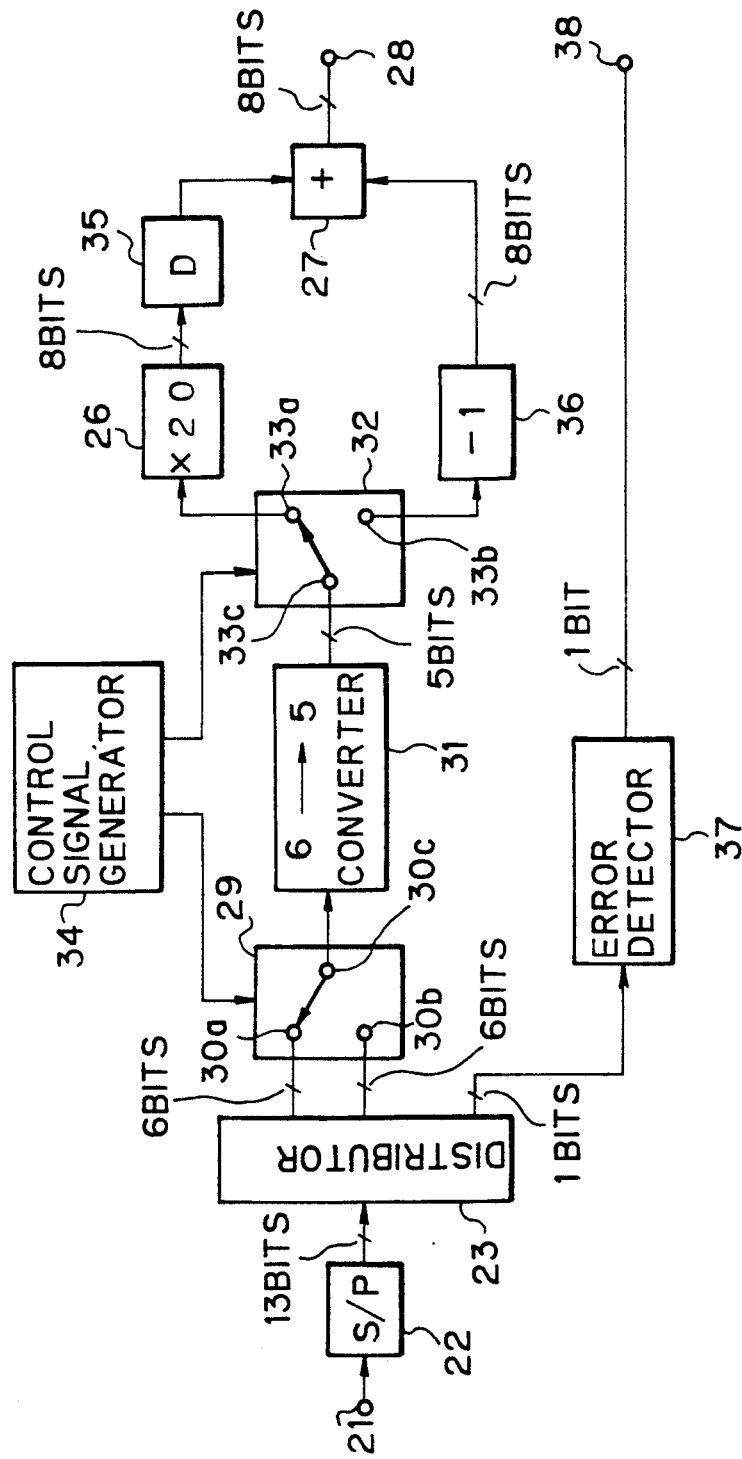
FIG. 5 is a block diagram of a demodulator circuit used in the further embodiment of the invention.

FIG. 5 shows an associated demodulator circuit used in the further embodiment. 13-bit data which has been converted into parallel data by a serial-parallel converter circuit 22 is fed to a distributor circuit 23. The distributor circuit 23 decomposes 13 bits into 6 bits corresponding to the quotient, 6 bits corresponding to the residue and a coupling bit (1 bit) added to the residue 6 bits. 6 bits are supplied to input terminals 30a and 30b of a switching circuit 29. An output of the switching circuit 29 is supplied to a data converter circuit 31.

The data converter circuit 31 converts 6-bit coded bits into 5-bit data bits, in contrast to the data converter circuit 11 of the modulator circuit. A 5-bit output from the data converter circuit 31 is fed to an input terminal 33c of a switching circuit 32. The quotient 5 bits taken out at one output terminal 33a of the switching circuit 32 undergo ($\times 20$) operation in a multiplier circuit 26. The residue 5 bits taken out at the other output terminal 33b of the switching circuit 32 are fed to a ($-1$) circuit 36.

In order to control the switching circuit 29 and 32, a control signal generator circuit 34 is provided. When the input terminal 30a and the output terminal 30c are connected, the input terminal 33c and the output terminal 33a are connected by the control signal generator circuit 34. When the input terminal 30b and the output terminal 30c are connected, the input terminal 33c and the output terminal 33b are connected by the control signal generator circuit 34. An 8-bit output of the multiplier circuit 26 is fed to an adder circuit 27 via a delay circuit 35 in which an output of the delay circuit 35 and an output of the ($-1$) circuit 36 are added to form output data.

The delay circuit 35 compensates a delay from the time when the output of the multiplier circuit 26 has been obtained until the time when the residue data is obtained from the ($-1$) circuit 36. The ($-1$) circuit 36 performs a mutual compensatory processing with the (+1) circuit 10 of the modulator circuit.

One bit acting as the coupling bit is not necessary for data conversion. However, its nature of being always "0" may be used for error detection. An error detector circuit 37, supplied with such a coupling bit, decides the absence of an error when the coupling bit is "0", but decides the presence of an error when the coupling bit is "1" and generates an error flag of 1 bit at an output terminal 38.

As mentioned above, this invention decomposes M bits into a plurality of data bits by a dividing processing upon converting M bits into N bits and converts respective data bits into coded bits Therefore, it contributes to simplification and scale reduction of the converter circuit.

What is claimed is:

1. A digital modulating apparatus for coding a digital signal of M bit words into a digital signal of N bit words (M<N), comprising:

a divider for dividing an input signal formed of M-bit words by a predetermined number greater than M and outputting a signal indicative of a quotient and a signal indicative of a residue of the division;

code converting means including a bit pattern conversion table for converting the quotient output signal and the residue output signal of said dividing means into respective output signals of $n_i$ bit words $$\left( \sum_{i=1}^{k} n_1 = N \right);$$

and a composer for composing said $n_i$ bit words of the converted quotient output signal and the converted residue output signal from said code converting means into a composite word of N bits and outputting a signal formed of the composite words.

2. A digital modulating apparatus according to claim 1, wherein said divider produces output signals of $h_i$ bits respectively representing values of $l_i$, where $$\left( 2^M \leq \prod_{i=1}^{k} l_i \right)$$

and ($l_i \leq 2^{h_i}$) and the output signals of $h_i$ bits are converted into respective words of $n_i$ bits $$\left( \sum_{i=1}^{k} n_i = N \right)$$

by said code converting means.

3. A digital modulating apparatus according to claim 2, wherein said code converting means comprises two separate bit converters, each commonly using at least a part of said bit pattern conversion table.

4. A digital modulating apparatus according to claim 2, wherein said signal indicative of the quotient and said signal indicative of a residue output from said divider are both formed of words of the same number of bits and are fed to the code converting means in a time-divisional manner using a switching means.

5. A digital demodulating apparatus for demodulating a signal of N bit words that was obtained by coding a digital signal of M bit words into a digital signal of N bit words (M<N), comprising:

a distributing circuit for dividing each N-bit word of an input signal into a plurality of signals of $n_i$ bits $$\left( \sum_{i=1}^{k} n_i = N \right)$$

and outputting the signals of $n_i$ bits;

code converting means including a bit pattern conversion table for converting said plurality of signals of $n_i$ bit words into signals indicative of a quotient signal and a residue signal, which were obtained in the coding of the digital signal by dividing the digital signal of M bit words by a predetermined number;

a signal multiplier for multiplying the output signal indicative of the quotient from said code converting means by the predetermined number; and a signal adder for adding the signal indicative of the residue from said code converting means and the output signal from said signal multiplier and producing a summed output signal therefrom.

6. A digital demodulating apparatus according to claim 5, wherein said plurality of signals of $n_i$ bits comprises two signals and said code converting means comprises two separate bit converters, each commonly using at least a part of said bit pattern conversion table.

7. A digital demodulating apparatus according to claim 5, wherein plurality of signals of $n_i$ bits from said distributing circuit are each formed of words of the same number of bits and are fed to the code converting means in a time-divisional manner using a switching means.

8. A digital demodulating apparatus according to claim 5, wherein said distributing circuit separates a coupling word of $n_j$ bits from each N-bit word of the input signal and divides the residual ($N-n_j$) bits into $n_i$ bit words.

9. A digital demodulating apparatus according to claim 8, further comprising an error detector receiving the coupling word of $n_j$ bits for performing error detection on the input signal.

* * * * *